US006862214B2

(12) United States Patent
Lee et al.

(10) Patent No.: US 6,862,214 B2
(45) Date of Patent: Mar. 1, 2005

(54) PHASE CHANGE MEMORY ARRAY (75) Inventors: Keun-ho Lee, Seoul (KR); Chang-sub Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/786,303

(22) Filed: Feb. 26, 2004

(65) Prior Publication Data

US 2004/0170053 A1 Sep. 2, 2004

(30) Foreign Application Priority Data

Feb. 28, 2003 (KR) ................................ 10-2003-0012812

(51) Int. Cl.[7] .............................................. G11C 11/00
(52) U.S. Cl. ........................ 365/163; 365/63; 365/100
(58) Field of Search .......................... 365/163, 63, 100, 365/72

(56) References Cited

U.S. PATENT DOCUMENTS 6,480,438 B1 * 11/2002 Park ...................... 365/230.06
6,590,907 B1 * 7/2003 Jones et al. ................. 370/489
6,707,712 B2 * 3/2004 Lowery ...................... 365/175

* cited by examiner

Primary Examiner—Son T. Dinh
(74) Attorney, Agent, or Firm—Volentine Francos & Whit P.L.L.C.

(57) ABSTRACT

A phase change memory includes a plurality of word lines, a plurality of bits lines intersecting the word lines, and a plurality of memory cells arranged in rows along the word lines and located at corresponding intersection regions of the word lines and bit lines. Each of the memory cells includes a cell transistor having a gate connected to a corresponding word line, and a resistor and a phase change cell connected in series between a drain of the cell transistor and a corresponding bit line. In order to increase a cell drive current, the phase change memory also includes a plurality of auxiliary transistors respectively connected between the drains of the cell transistors of adjacent said memory cells.

27 Claims, 8 Drawing Sheets

PHASE CHANGE MEMORY ARRAY

BACKGROUND OF THE INVENTION

1. Field of the Invention

The present invention generally relates to memory devices, and more particularly, the present invention relates to phase change memory cell arrays.

A claim of priority is made to Korean Patent Application No. 2003-12812, filed on Feb. 28, 2003, in the Korean Intellectual Property Office, the disclosure of which is hereby incorporated by reference in its entirety.

2. Description of the Related Art

Phase change memory cell devices rely on phase change materials, such as chalcogenide, which are capable of stably transitioning between amorphous and crystalline phases. The differing resistance values exhibited by the two phases are used to distinguish logic values of the memory cells. That is, an amorphous state exhibits a relatively high resistance, and a crystalline state exhibits a relatively low resistance.

The phase of the phase change material of each memory cell is set by Joule heating of the material according to an amount of current passed through the material. To obtain an amorphous state (referred to as a "reset" state), a relatively high current is passed through the phase change material to melt the material for a short period of time. The current is removed and the cell cools rapidly to below the melting point. The melting point of chalcogenide, for example, is approximately 610° C. To obtain a crystalline state (referred to as a "set" state), a lower current pulse is applied to the material for a longer period of time. This causes the material to re-crystallize to a crystalline state which is maintained once the current is removed and the cell is rapidly cooled. For example, in the case of a chalcogenide material, current is applied to obtain a crystallization temperature of approximately 210° C. for a few tens of nanoseconds.

Figure 1:
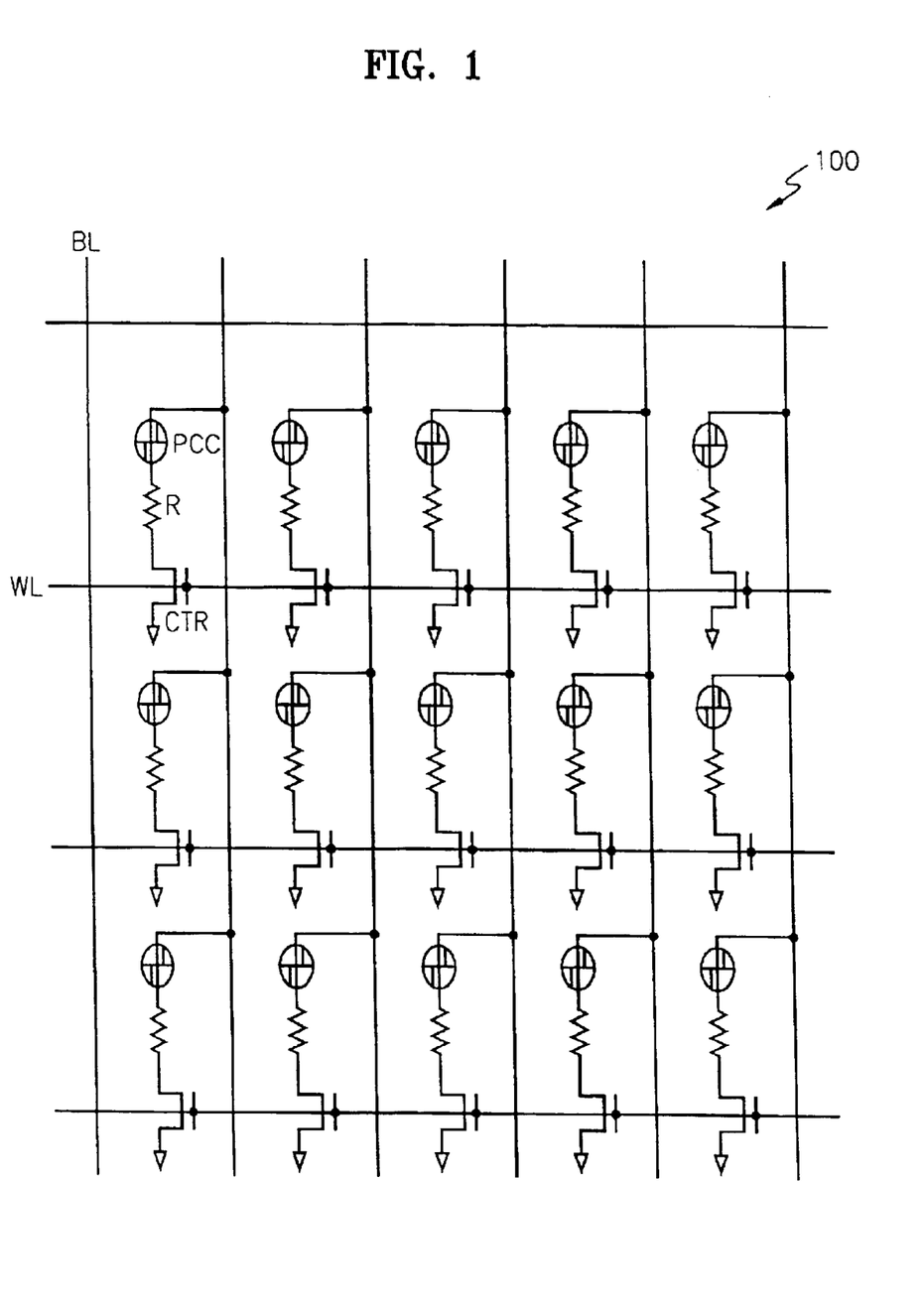
FIG. 1 illustrates a conventional phase change memory.

FIG. 1 is a circuit representation of a conventional phase change memory. As shown, the phase change memory 100 includes an array of phase change memory cells, each of which includes a cell transistor CTR, a phase change cell PCC, and a resistor R. The cell transistor CTR has a gate connected to a word line WL. The phase change cell PCC is serially connected to the resistor R between a drain of the cell transistor CTR and a bit line BL. When both the word line WL and the bit line BL of a corresponding memory cell are selected, a current is applied to the phase change cell PCC of the memory cell to switch the state of the phase change cell PCC.

As mentioned above, the phase change cell PCC relies on Joule heating to change its state, and a relatively high write current is needed to obtain the required level of heating. Hence, the cell transistor of each memory cell must have a current drive capacity which is superior to that of other memory devices.

Unfortunately, it is difficult to satisfactorily achieve the necessary cell current drive using conventional CMOS process technology. For example, any increase in drive current must be attended by an increase in the width of the phase change cell transistor. This increases the overall size of the phase change cell, which runs counter to industry demands towards increased integration.

In an attempt to obtain a sufficient cell drive current of the phase change memory, many studies have proposed the use of bipolar junction transistors as the cell transistors of the phase change memory. This is because the current drive capacity of the bipolar junction transistor is superior to that of the CMOS transistor. More specifically, it has recently been suggested that BiCMOS process technology be adopted in which the phase change memory is fabricated to include CMOS transistor control circuits and bipolar junction cell transistors. However, when compared to CMOS technology, BiCMOS technology is difficult to control and is characterized by highly complex design and manufacturing processes.

SUMMARY OF THE INVENTION

According to one aspect of the present invention, a phase change memory array is provided which includes a plurality of word lines, a plurality of bit lines intersecting the word lines, and a plurality of memory cells arranged in rows along the word lines and located at corresponding intersection regions of the word lines and bit lines. Each of the memory cells includes a cell transistor having a gate connected to a corresponding word line, and a resistor and a phase change cell connected in series between a drain of the cell transistor and a corresponding bit line. In addition, the phase change memory also includes a plurality of auxiliary transistors respectively connected between the drains of the cell transistors of adjacent memory cells.

According to another aspect of the present invention, a phase change memory array is provided which includes a plurality of word lines, a plurality of bits lines intersecting the word lines, and a plurality of memory cells arranged in rows along the word lines and located at corresponding intersection regions of the word lines and bit lines. Each of the memory cells includes a cell transistor having a gate connected to a corresponding word line, a resistor and a phase change cell connected in series between a drain of the cell transistor and a corresponding bit line. In addition, the memory array includes a plurality of vertical gates respectively interposed between the drains of the cell transistors of adjacent memory cells, where each of the vertical gates extends from and in a same layer as a corresponding word line.

According to still another aspect of the present invention, a phase change memory array is provided which includes a plurality of word line pairs, a plurality of bit lines intersecting the word line pairs, and a plurality of memory cells arranged in rows between the word lines of a corresponding word line pair and located at intersection regions of the word line pairs and bit lines, respectively. Each of the memory cells includes a cell transistor having a gate connected to a corresponding word line pair, and a resistor and a phase change cell connected in series between a drain of the cell transistor and a corresponding bit line. In addition, the memory array includes a plurality of vertical gates respectively interposed between the drains of the cell transistors of adjacent memory cells, where each of the vertical gates is connected between the word lines of a corresponding word line pair and in a same layer as the corresponding word line pair.

According to still another aspect of the present invention, a phase change memory array is provided which includes a plurality of word line pairs, a plurality of bit lines intersecting the word line pairs, and a plurality of memory cells arranged in rows between the word lines of a corresponding word line pair and located at intersection regions of the word line pairs and bit lines, respectively. Each of the memory cells includes a cell transistor having a gate connected to a corresponding word line pair, and a resistor and a phase change cell connected in series between a drain of the cell transistor and a corresponding bit line. In addition, the memory array includes a plurality of vertical gates respectively connected at one end between the word lines of a respective word line pair and in a same layer as the respective word line pair.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF THE PREFERRED EMBODIMENTS

The present invention will now be described more fully with reference to the accompanying drawings, in which preferred embodiments of the invention are shown. In the drawings, the forms of elements are exaggerated for clarity. Identical reference characters have been used, where possible, to designate identical elements that are common in the figures.

Figure 2:
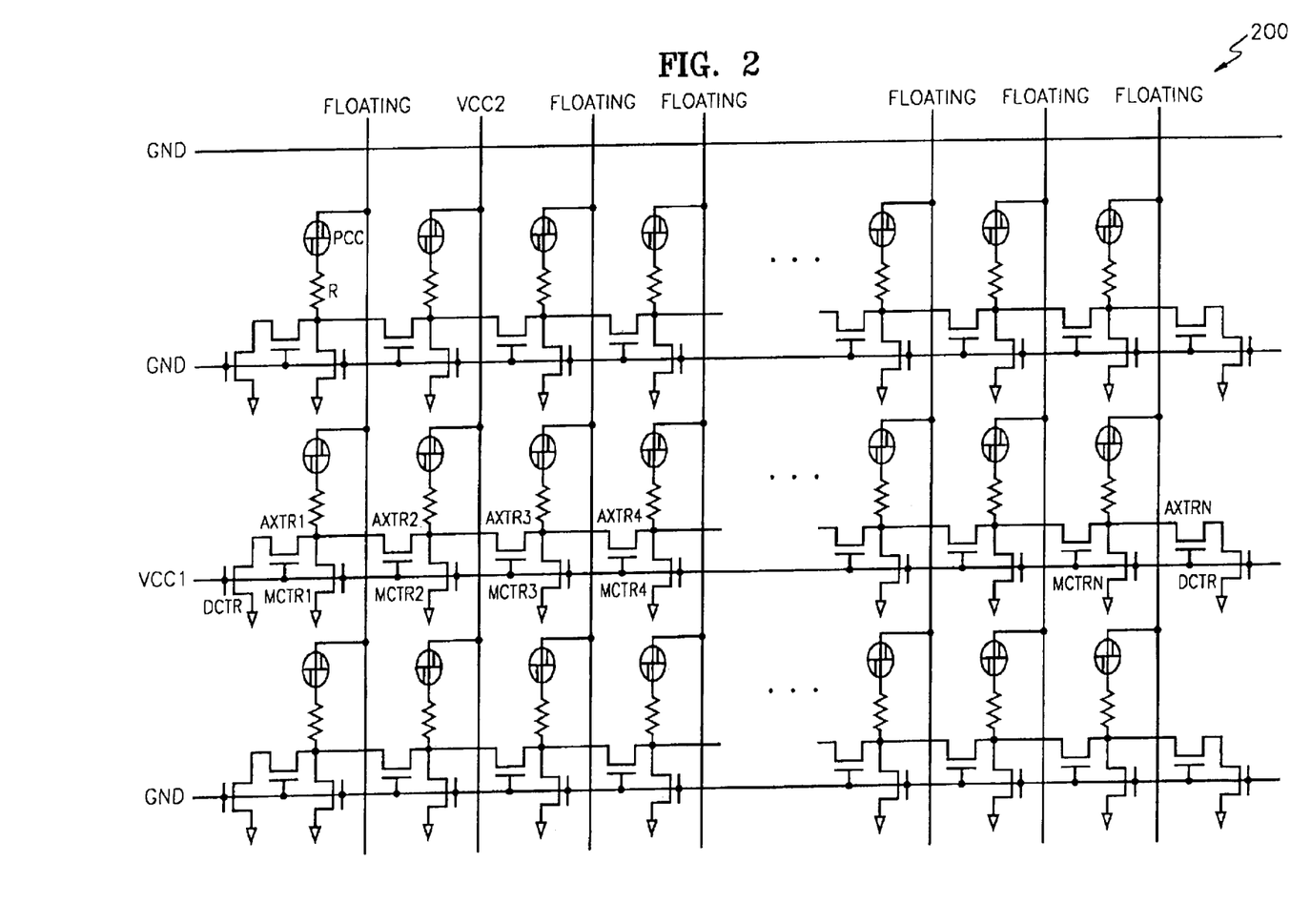
FIG. 2 illustrates a phase change memory according to a first embodiment of the present invention.

FIG. 2 illustrates a phase change memory according to a first embodiment of the present invention.

Referring to FIG. 2, a phase change memory 200 includes an array of phase change memory cells arranged in rows. Each of the rows of phase change memory cells includes a plurality of cell transistors MCTR1–MCTRN, a plurality of phase change cells PCC1 through PCCN, and a plurality of R1 to RN resistors R. Each of the cell transistors MCTR1–MCTRN has a gate connected to a common word line. Considering the $m^{th}$ phase change memory cell (where m is an integer between 1 and N), the phase change cell PCCm is serially connected to the resistor Rm between a drain of the cell transistor MCTRm and a bit line. The cell transistors MCTRm and MCTRm+1 are connected by the auxiliary transistor AXTRm+1.

The cell transistors MCTR1–MCTRN of this embodiment are MOS transistors, but instead they may be implemented as bipolar junction transistors.

The phase change memory 200 of FIG. 2 is at least partially distinguished from the conventional phase change memory 100 of FIG. 1 in that the drains of the cell transistors MTCR1–MCTRN are connected by the auxiliary transistors AXTR1–AXTRN.

The auxiliary transistors AXTR1–AXTRN+1 are connected to the same word line to which the cell transistors MCTR1–MCTRN are connected.

Hereinafter, the operation of the phase change memory 200 of FIG. 2 will be described with reference to FIG. 2. For purposes of explanation, assume that the word line of a given memory cell having phase change cell PCCm is selected by application of a supply voltage VCC1, while the remaining word lines are connected to ground (GND). Similarly, assume that the bit line of the given memory cell receives a supply voltage VCC2, while the remaining bit lines are floating. In this case, the cell transistors MCTR1–MCTRN and the auxiliary transistors AXTR1–AXTRN+1 of the selected word line are all turned on, and current then flows through the phase change cell PCCm connected to the selected bit line.

Since the auxiliary transistors of the selected word line are all turned on, and since the auxiliary transistors are connected across the drains of adjacent cell transistors, a parallel current path is establish through all of the cell transistors. This results in an increase in drive current through the selected phase change cell PCCm.

The increase in drive current through a particular phase change cell is primarily achieved through the cell transistors immediately adjacent phase change cells.

Each auxiliary transistor AXTRm is preferably placed between the cell transistors MCTRm−1 and MCTRm which are separated by a shallow trench isolation (STI) region.

The cell transistors CTR of the conventional phase change memory 100 of FIG. 1 are separated by an STI region, but in the first embodiment of the present invention, the auxiliary transistors AXTR1–AXTRN are placed in the STI regions. Thus, it is not necessary to increase the size of the phase change memory 200 to make room for the auxiliary transistors AXTR1–AXTRN+1.

The phase change memory 200 further includes dummy cell transistors DCTR1 and DCTR2 at both ends of the word line to which the cell transistors MCTR1–MCTRN are connected on common.

The auxiliary transistors AXTR1–AXTRN+1 are important to the proper distribution of the cell drive. As mentioned above, the increase in the cell drive current results mainly from the increase in the cell drive current through the drains of the two adjacent cell transistors. Accordingly, the dummy cell transistors DCTR1 and DCTR2 are provided such that the increase in the cell drive current through the cell transistors MCTR1 and MCTRN is comparable to the increase in the cell drive current through the other cell transistors MCTR2–MCTRN−1.

Figure 3:
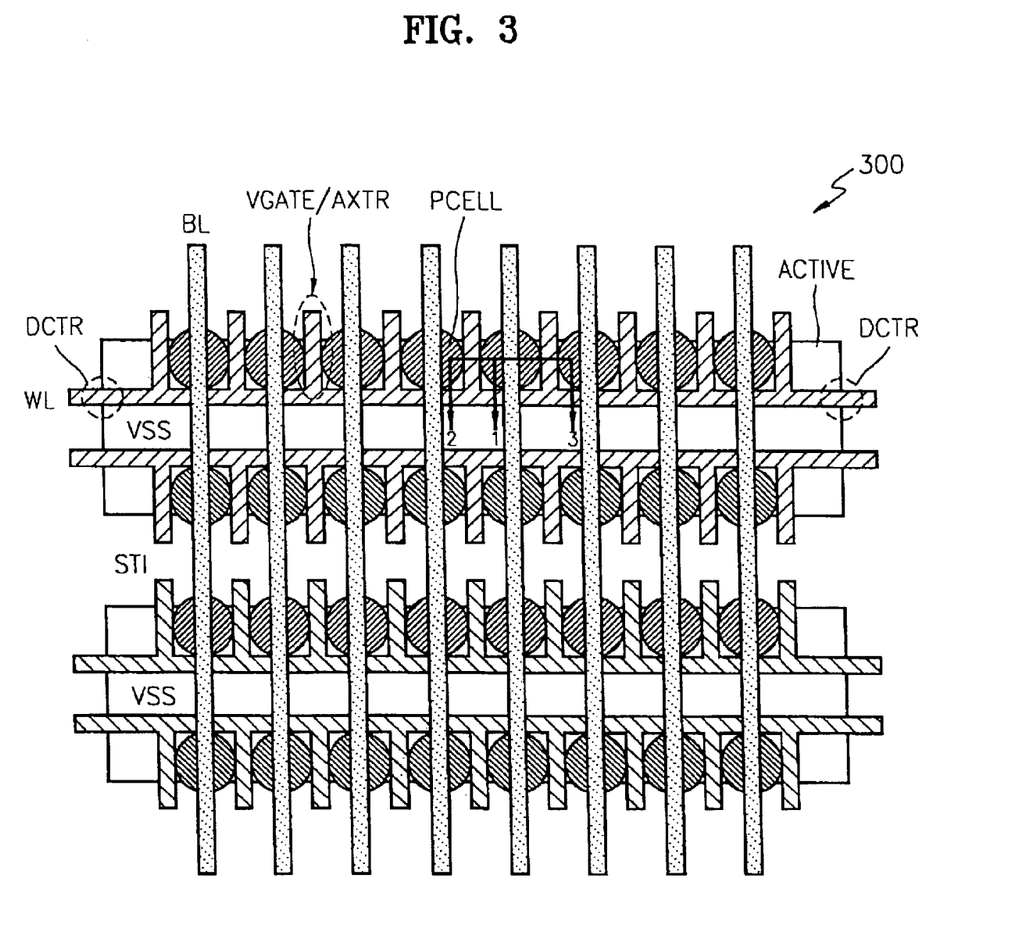
FIG. 3 illustrates a layout of a phase change memory according to a second embodiment of the present invention.

FIG. 3 illustrates a layout of a phase change memory according to a second embodiment of the present invention.

Referring to FIG. 3, the phase change memory 300 includes a plurality of cell transistors, a plurality of phase change cells, and a plurality of resistors. Each cell transistor has a gate connected to a word line WL. The phase change cell is serially connected to the resistor between the drain of the cell transistor and a bit line BL. A vertical gate VGATE is interposed between two adjacent cell transistors from adjacent phase memory cells that are connected to the same word line WL. The vertical gate VGATE is in the same layer that of the word line WL, and is connected to the word line WL.

The vertical gate VGATE acts as the auxiliary transistor of FIG. 2. A cell PCELL indicates one cell includes a phase change cell, a resistor and a cell transistor. The word line WL in FIG. 3 is connected to the gates of the cell transistors.

The vertical gate VGATE is used as the auxiliary transistor connected to the word line WL and is interposed between the drains of two of the adjacent cell transistors.

Since the vertical gate VGATE is connected to the word line WL, the shape of the word line WL and VGATE together is similar to a comb. A plurality of cells PCELL is placed on each active region ACTIVE. The drains of the cell transistors, connected to each of the cells PCELL, are separated by the vertical gates VGATE.

In FIG. 3, a conventional STI region does not exist between the cells PCELL that are connected to the word line WL. Instead, the vertical gates VGATE are interposed between two adjacent cells PCELL, which prevents an increase in the overall size of the phase change memory.

Similar to the description of the phase change memory 200 of FIG. 2, a plurality of dummy cell transistors DCTR are placed at both ends of the word line WL. This arrangement evenly distributes the current to each of the cell transistors MCTR1–MCTRN of the word line WL.

Hereinafter, the cell drive current, increased by this arrangement, will be described. Referring to FIG. 3, the cell drive current can be classified into a drive current 1 flowing from the cell PCELL into the cell transistor directly connected to the cell PCELL and drive currents 2 and 3 flowing from one cell PCELL into adjacent cell transistors connected to the cell PCELL through adjacent vertical gates VGATE.

If the vertical gates VGATE are equal in width and length, then each of drive currents 2 and 3 is half the drive current 1. Thus, the increased amount of cell drive current according to the present invention may be double that of the conventional phase change memory. However, the increased amount of cell drive current varies with the width and length of the vertical gates VGATE, and accordingly, the increased amount of cell drive current is not limited to double that of the conventional phase change memory.

Two word lines are placed on each active region ACTIVE, and cells that share the two word lines share a ground voltage VSS region. Two active regions are separated by the STI region.

Figure 4:
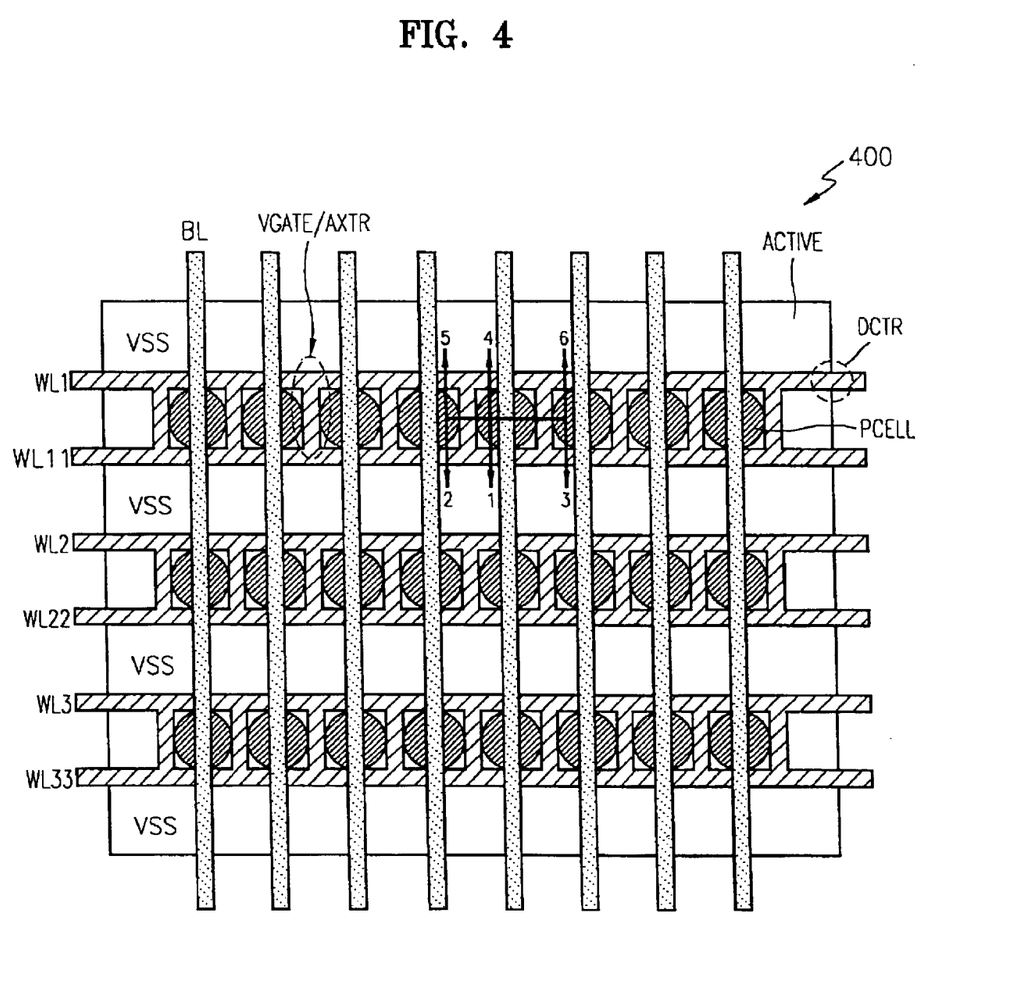
FIG. 4 illustrates a layout of a phase change memory according to a third embodiment of the present invention.

FIG. 4 illustrates a layout of a phase change memory according to a third embodiment of the present invention.

Figure 5:
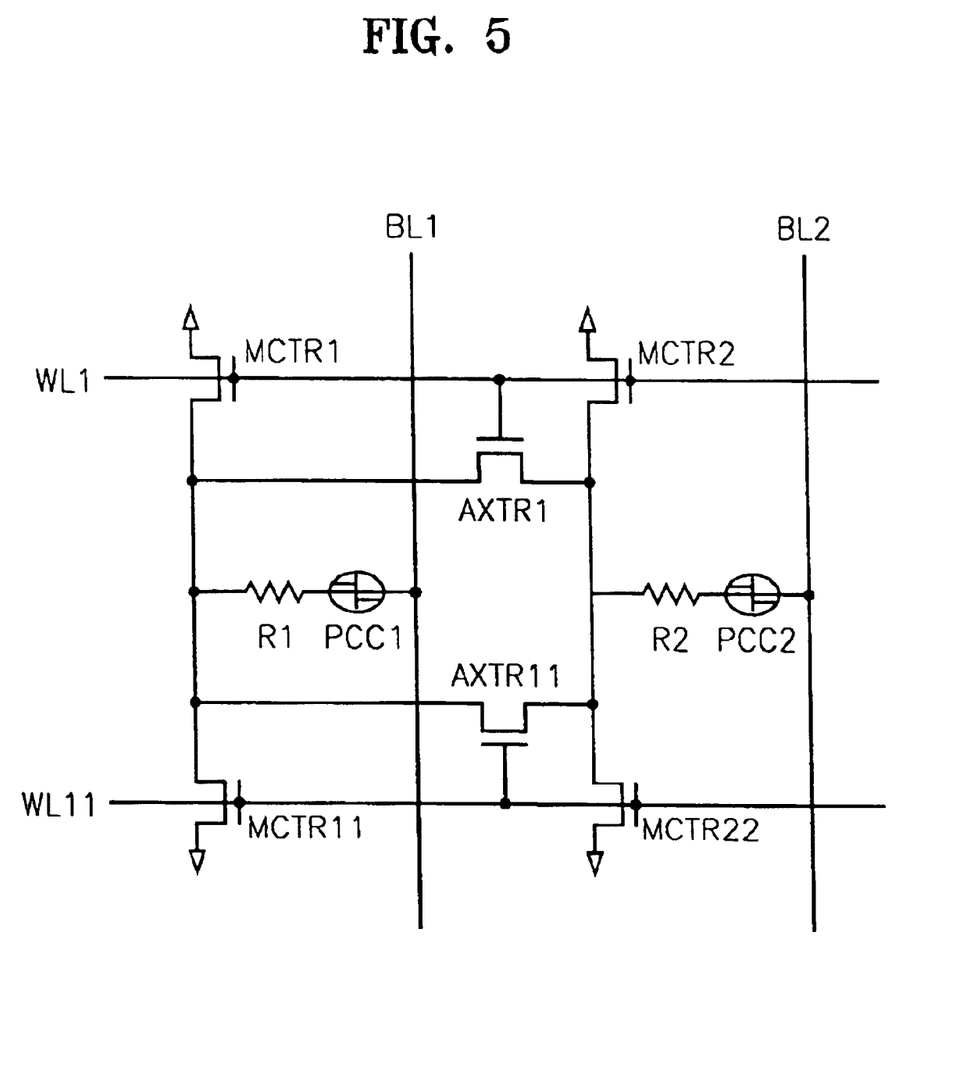
FIG. 5 is a circuit diagram of a phase change cell of FIG. 4.

FIG. 5 is a circuit diagram of two phase change memory cells of FIG. 4.

Referring to FIGS. 4 and 5, the phase change memory 400 includes first and second word lines WL1 and WL11, third and fourth word lines WL2 and WL22, and fifth and sixth word lines WL3 and WL33 arranged in pairs, a plurality of cell transistors, and a plurality of cells PCELL. Considering the pair of first and second word lines W1 and W11, the first and second cell transistors MTCR1 and MCTR11 have gates connected to the first and second word lines W1 and W11, respectively. A first phase change cell PCC1 is serially connected to a first resistor R1 between the drains of the first and second cell transistors MCTR1 and MCTR11, and a bit line BL1. First and second auxiliary transistors AXTR1 and AXTR11 are interposed between the first and second cell transistors MCTR1 and MTCR11, and the third and fourth cell transistors MCTR2 and MCTR22. The first and second auxiliary transistors AXTR1 and AXTR11 are connected between and placed in the same layer as the first and second word lines WL1 and WL11.

In the phase change memory 400, each pair of word lines is configured to have a dual gate structure. Each vertical gate VGATE connects two word lines as a pair. Thus, the shape of each pair of the word lines and vertical gates in combination is similar to a ladder.

The phase change memory 400 does not include STI regions. The cells PCELL, which are connected to the same word line, are separated by the vertical gates VGATE. The vertical gates VGATE are placed between the cells PCELL.

The cells PCELL, connected to different pairs of word lines, are separated by the pairs of word lines WL11 and WL 2, and WL22 and WL3, instead of STI regions.

When a pair of word lines is configured to have a dual gate structure, it is possible to place the first and second cell transistors MCTR1 and MTCR11 above and below the first and second phase change cells PCC1 and PCC2, thereby improving the control of the cell drive current and increasing the drive current using the vertical gates VGATE, i.e., the first and second auxiliary transistors AXTR1 and AXTR11, as shown in FIG. 5.

The number of cell transistors directly connected to the phase change cells PCC is double that of the phase change memory 300 of FIG. 3, so the amount of cell drive current is double that of the phase change memory 300 of FIG. 3.

For example, when the first and second word lines WL1 and WL11 are selected, the $1^{st}$, $2^{nd}$, $3^{rd}$, and $4^{th}$ cell transistors MCTR1, MCTR11, MCTR2, and MCTR22, connected to the first and second word lines WL1 and WL11 are turned on. The first and second auxiliary transistors AXTR1 and AXTR11 that are connected to the pair of word lines WL1 and WL11 are also turned on.

When a bit line BL2 is selected, drive currents 1 and 4 flow into the third and fourth cell transistors MCTR2 and MCTR22 directly connected to the second phase change cell PCC2, drive currents 2 and 5 flow through the adjacent first and second cell transistors MCTR1 and MTCR11 which are connected to the first and second adjacent auxiliary transistors AXTR1 and AXTR11, i.e., adjacent vertical gates VGATE, and drive currents 3 and 6 flow into adjacent cell transistors (not shown) connected by adjacent auxiliary transistors (not shown).

The drive current 1 is equal to the drive current 4. Each of the drive currents 2, 5, 3, and 6 is half the drive current 1. Thus, the increased drive current according to the third embodiment of the present invention is four times that of conventional phase change memory, while being double that of the phase change memory 300 of FIG. 3.

Each row of cells PCELL includes a ground voltage VSS region. Although each row of cells PCELL has an extra word line, the added word lines are placed in the conventional STI regions. Thus, the overall size of the phase change memory 400 does not change.

The phase change memory 400 includes dummy cell transistors DCTR at both ends of each word line. As described above, the dummy cell transistors DCTR are intended to evenly distribute the cell drive current over the word lines.

Figure 6:
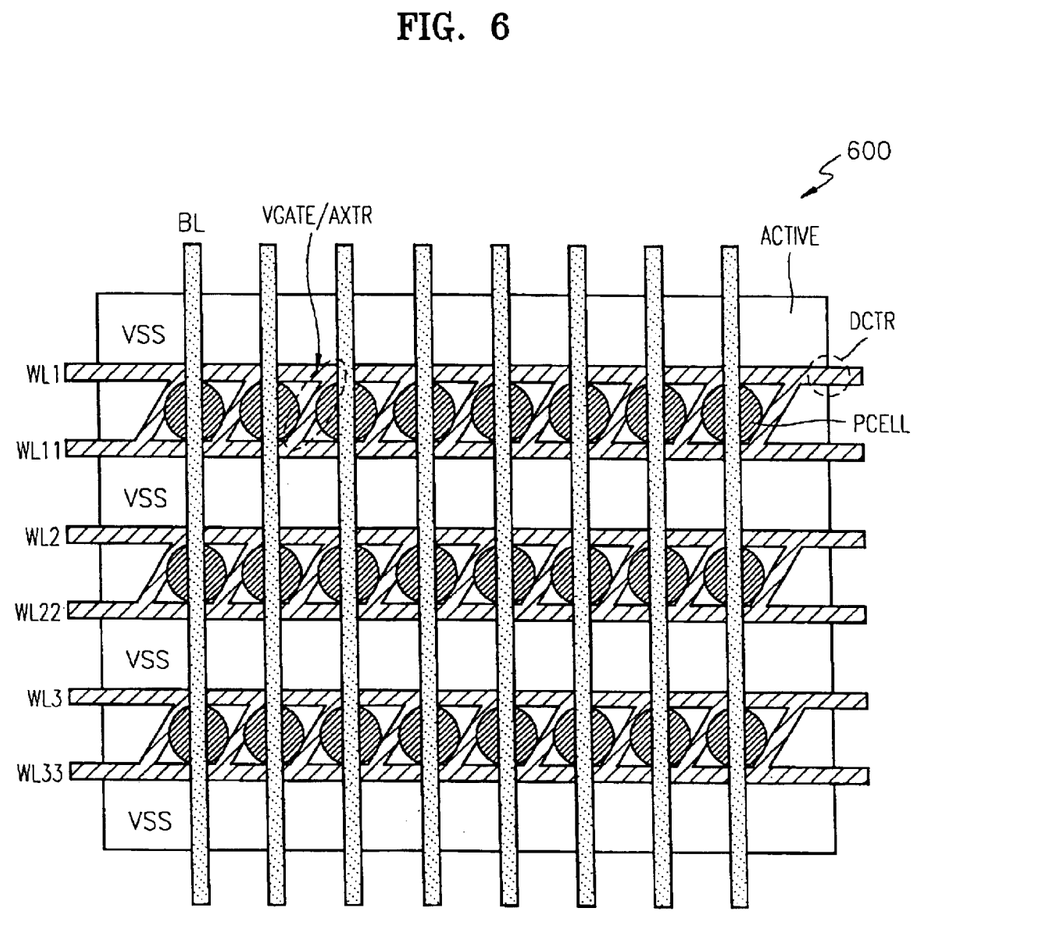
FIG. 6 illustrates a layout of the phase change memory according to a modification of the third embodiment of the present invention.

FIG. 6 illustrates a layout of the phase change memory 400 of FIG. 4 where the shape of the vertical gates is different from the phase change memory 300 of FIG. 4.

Referring to FIG. 6, the vertical gates VGATE extend obliquely between the word lines, rather than perpendicularly as shown in FIG. 4. This placement increases the length of the vertical gates VGATE. Thus, the current drive ability is improved, and the cell drive current increases.

Figure 7:
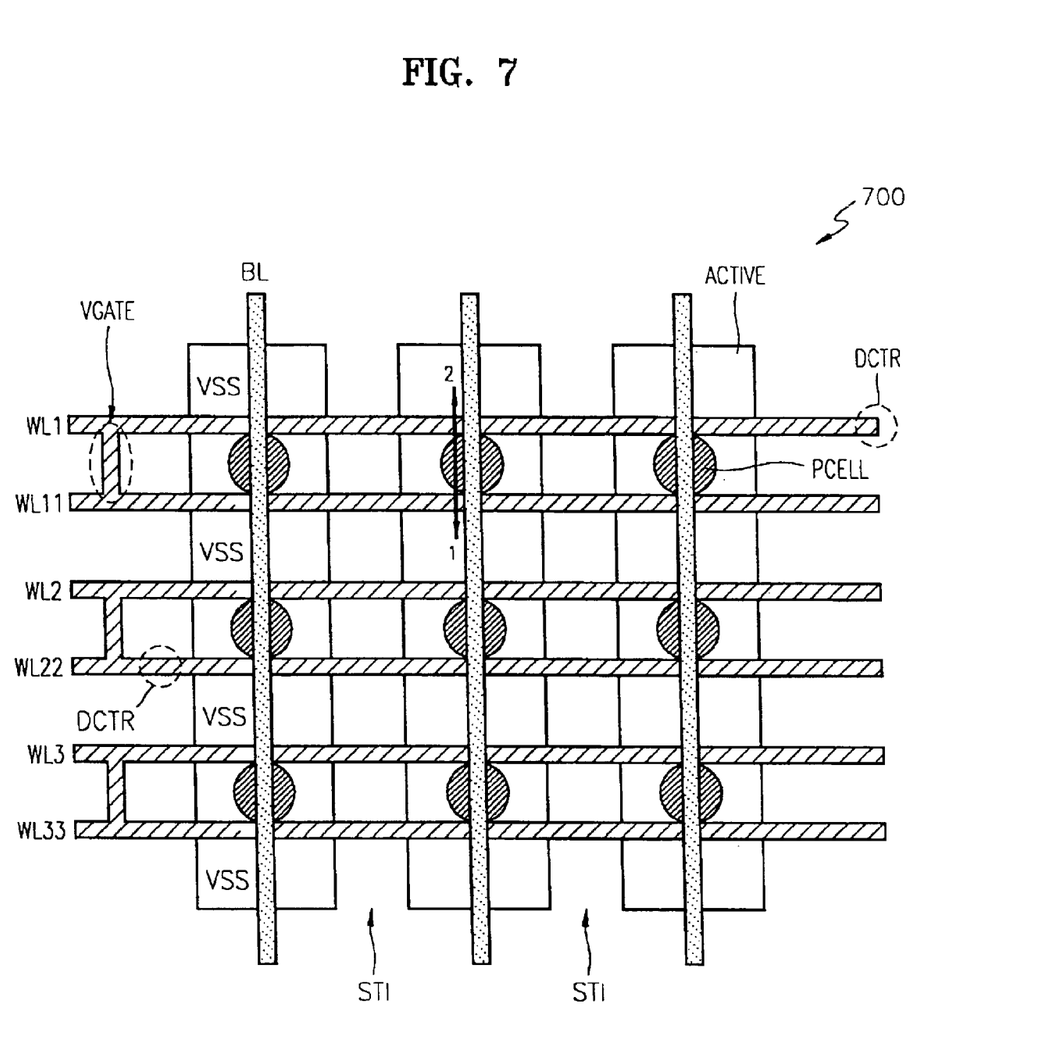
FIG. 7 illustrates a layout of a phase change memory according to a fourth embodiment of the present invention.

FIG. 7 illustrates a layout of a phase change memory according to the fourth embodiment of the present invention.

Referring to FIG. 7, the phase change memory 700 includes first and second word lines WL1 and WL11, third and fourth word lines WL2 and WL22, and fifth and sixth word lines WL3 and WL33 arranged in pairs, pairs of cell transistors, and cells PCELL. Each pair of cell transistors has gates connected to the first and second word lines WL1 and WL11, the third and fourth WL2 and WL22, or the fifth and sixth WL3 and WL33. Each cell PCELL is connected between the drains of each pair of cell transistors and each bit line BL. The pairs of first and second word lines WL1 and WL11, third and fourth word lines WL2 and WL22, and fifth and sixth word lines WL3 and WL33 are each connected by respective vertical gates VGATE. The vertical gates VGATE are placed in the same layer as that of the corresponding pairs of first and second word lines WL1 and WL11, third and fourth word lines WL2 and WL22, and fifth and sixth word lines WL3 and WL33.

The phase change memory 700 also has the word lines of dual gate structures similar to the phase change memory 400 of FIG. 4. However, the pairs of word lines have the vertical gate VGATE at only one end of each pair.

Thus, cell transistors connected to the same word line are not separated by vertical gates VGATE. Instead, cell transistors are separated by the conventional STI regions.

Row memory array blocks are separated by word lines. One word line of each pair of word lines is interposed between the row memory array blocks. In the same manner as the phase change memory 400 of FIG. 4, since one word line of each pair of word lines is placed on the conventional STI region, the overall size of the phase change memory 700 is not increased.

The increased drive current is double that of the conventional phase change memory.

In addition, the phase change memory 700 of FIG. 7 includes dummy cell transistors DCTR at both ends of each word line connected to gates of the cell transistors.

The structure of phase change memory 700 of FIG. 7 is identical to that of the phase change memory 400 of FIG. 4 except that the cell transistors connected to the same word line are not separated by the vertical gates, and instead are separated by the conventional STI regions. Therefore, the structure of the phase change memory 700 of FIG. 7 will not be described in detail here.

Figure 8:
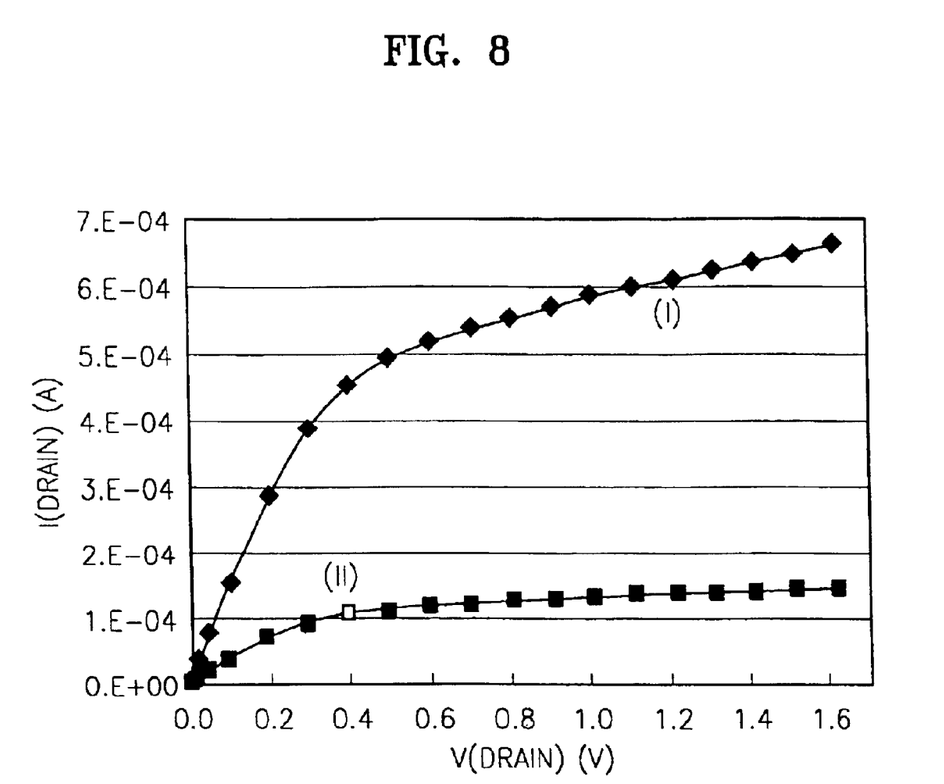
FIG. 8 illustrates a graph showing a cell drive current of the phase change memory of FIG. 4 and a cell drive current of the conventional phase memory cell of FIG. 1.

FIG. 8 illustrates graphs showing the cell drive current of the phase change memory 400 of FIG. 4 and the cell drive current of the conventional phase memory cell 100 of FIG. 1.

Referring to FIG. 8, the drive current of the phase change memory of the third embodiment of the present invention (I) increases to 4.5 times that of the conventional phase change memory (II).

As described above, the phase change memory according to the present invention can increase a cell drive current even when a MOS transistor is used as a cell transistor.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A phase change memory cell array, comprising:
   a plurality of word lines;
   a plurality of bit lines intersecting the word lines;
   a plurality of memory cells arranged in rows along the word lines and located at corresponding intersection regions of the word lines and bit lines, respectively, wherein each of the memory cells includes (a) a cell transistor having a gate connected to a corresponding word line, and (b) a resistor and a phase change cell connected in series between a drain of the cell transistor and a corresponding bit line; and
   a plurality of auxiliary transistors respectively connected between the drains of the cell transistors of adjacent said memory cells.

2. The phase change memory array of claim 1, wherein a gate of each of the auxiliary transistors is connected to a same word line as a gate of at least one of the respective cell transistors of the adjacent memory cells.

3. The phase change memory array of claim 1, wherein a gate of each of the auxiliary transistors is connected to a same word line as the gates of the respective cell transistors of the adjacent memory cells.

4. The phase change memory array of claim 1, further comprising a plurality of dummy cell transistor pairs connected at opposite ends of the word lines, respectively.

5. The phase change memory array of claim 1, wherein the cell transistors are MOS transistors.

6. The phase change memory array of claim 1, wherein the cell transistors are bipolar junction transistors.

7. A phase change memory array, comprising:
   a plurality of word lines;
   a plurality of bit lines intersecting the word lines;
   a plurality of memory cells arranged in rows along the word lines and located at corresponding intersection regions of the word lines and bit lines, respectively, wherein each of the memory cells includes (a) a cell transistor having a gate connected to a corresponding word line, and (b) a resistor and a phase change cell connected in series between a drain of the cell transistor and a corresponding bit line; and
   a plurality of vertical gates respectively interposed between the drains of the cell transistors of adjacent said memory cells, wherein each of the vertical gates extends from and in a same layer as a corresponding word line.

8. The phase change memory array of claim 7, wherein each vertical gate is connected to a same word line as the gates of the respective cell transistors of the adjacent memory cells.

9. The phase change memory array of claim 7, further comprising a plurality of dummy cell transistor pairs, each of which is located at both ends of each of the word lines.

10. The phase change memory array of claim 7, wherein the cell transistors are MOS transistors.

11. The phase change memory array of claim 7, wherein the cell transistors are bipolar junction transistors.

12. A phase change memory array, comprising:
   a plurality of word line pairs;
   a plurality of bit lines intersecting the word line pairs;
   a plurality of memory cells arranged in rows between the word lines of a corresponding word line pair and located at intersection regions of the word line pairs and bit lines, respectively, wherein each of the memory cells includes (a) a cell transistor having a gate connected to a corresponding word line pair, and (b) a resistor and a phase change cell connected in series between a drain of the cell transistor and a corresponding bit line; and
   a plurality of vertical gates respectively interposed between the drains of the cell transistors of adjacent said memory cells, wherein each of the vertical gates is connected between the word lines of a corresponding word line pair and in a same layer as the corresponding word line pair.

13. The phase change memory array of claim 12, wherein each vertical gate is connected to a same word line as the gates of the respective cell transistors of the adjacent memory cells.

14. The phase change memory array of claim 12 further comprising a plurality of dummy cell transistor pairs, each of which is located at both ends of each of the word line pairs.

15. The phase change memory array of claim 12, wherein one word line of each word line pair is interposed between row memory array blocks.

16. The phase change memory array of claim 12, wherein each word line pair is interposed between row memory array blocks.

17. The phase change memory array of claim 12, wherein a region of the array of memory cells is devoid of a shallow trench isolation (STI) structure.

18. The phase change memory array of claim 12, wherein each vertical gate extends obliquely between the word lines of the corresponding word line pair.

19. The phase change memory array of claim 12, wherein the cell transistors are MOS transistors.

20. The phase change memory array of claim 12, wherein the cell transistors are bipolar junction transistors.

21. A phase change memory array, comprising:
   a plurality of word line pairs;
   a plurality of bit lines intersecting the word line pairs;
   a plurality of memory cells arranged in rows between the word lines of a corresponding word line pair and located at intersection regions of the word line pairs and bit lines, respectively, wherein each of the memory cells includes (a) a cell transistor having a gate connected to a corresponding word line pair, and (b) a resistor and a phase change cell connected in series between a drain of the cell transistor and a corresponding bit line; and
   a plurality of vertical gates respectively connected at one end between the word lines of a respective word line pair and in a same layer as the respective word line pair.

22. The phase change memory array of claim 21 further comprising a plurality of dummy cell transistor pairs, each of which is located at both ends of each of the word lines.

23. The phase change memory array of claim 21, wherein one word line of each word line pair is interposed between row memory array blocks.

24. The phase change memory array of claim 21, wherein each word line pair is interposed between row memory array blocks.

25. The phase change memory array of claim 21, wherein columns of the phase change cells are separated by shallow trench isolation (STI).

26. The phase change memory array of claim 21, wherein the cell transistors are MOS transistors.

27. The phase change memory array of claim 21, wherein the cell transistors are bipolar junction transistors.

* * * * *